United States Patent
Chang et al.

(10) Patent No.: US 8,174,841 B2
(45) Date of Patent: May 8, 2012

(54) ADAPTIVE INTERCONNECT STRUCTURE

(75) Inventors: Leland Chang, New York, NY (US);
Matthew R. Wordeman, Kula, HI (US);
Albert M. Young, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 400 days.

(21) Appl. No.: 12/430,416

(22) Filed: Apr. 27, 2009

(65) Prior Publication Data
US 2010/0270676 A1    Oct. 28, 2010

(51) Int. Cl.
*H01R 43/00*    (2006.01)
(52) U.S. Cl. ........ 361/772; 361/760; 361/761; 361/791; 361/792; 361/765
(58) Field of Classification Search .................. 361/760, 361/761, 791, 792, 765; 257/773, 731, 506
See application file for complete search history.

(56) References Cited

U.S. PATENT DOCUMENTS

| | | | |
|---|---|---|---|
| 4,295,149 A | 10/1981 | Balyoz et al. | |
| 5,767,580 A | 6/1998 | Rostoker | |
| 5,998,875 A | 12/1999 | Bodo et al. | |
| 6,125,043 A | 9/2000 | Hauer et al. | |
| 6,919,515 B2 | 7/2005 | Blackshear et al. | |
| 7,049,642 B2 | 5/2006 | Shinjo | |
| 7,133,287 B2 * | 11/2006 | Campini et al. | 361/719 |
| 2008/0253085 A1 * | 10/2008 | Soffer | 361/687 |

FOREIGN PATENT DOCUMENTS
JP    9-321086    12/1997
* cited by examiner

*Primary Examiner* — Tuan T Dinh
*Assistant Examiner* — Hung Dang
(74) *Attorney, Agent, or Firm* — Scully, Scott, Murphy & Presser, P.C.; Louis J. Percello, Esq.

(57) ABSTRACT

An array of contact pads on a semiconductor structure has a pitch less than twice an overlay tolerance of a bonding process employed to vertically stack semiconductor structures. A set of contact pads within the area of overlay variation for a matching contact pin may be electrically connected to an array of programmable contacts such that one programmable contact is connected to each contact pad within the area of overlay variation. One contact pad may be provided with a plurality of programmable contacts. The variability of contacts between contact pins and contact pads is accommodated by connecting or disconnecting programmable contacts after the stacking of semiconductor structures. Since the pitch of the array of contact pins may be less than twice the overlay variation of the bonding process, a high density of interconnections is provided in the vertically stacked structure.

25 Claims, 10 Drawing Sheets

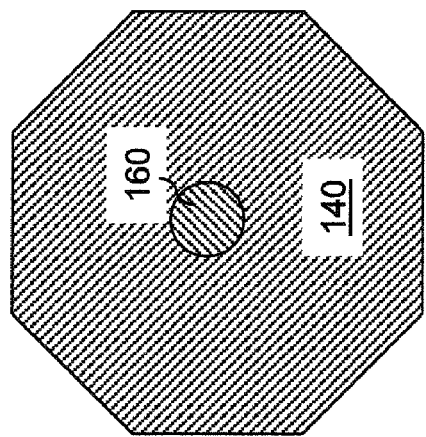
FIG. 2 (Prior Art)
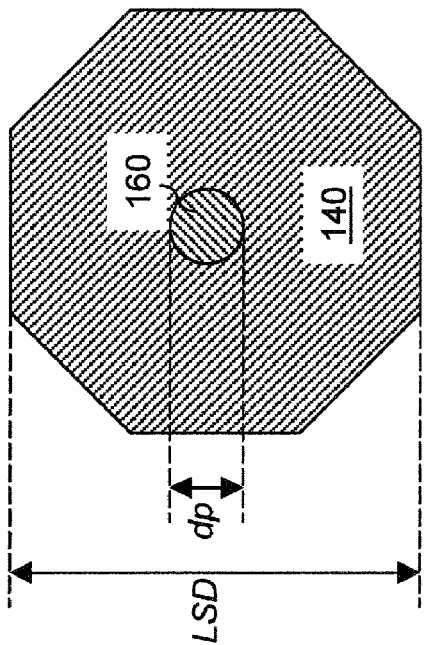
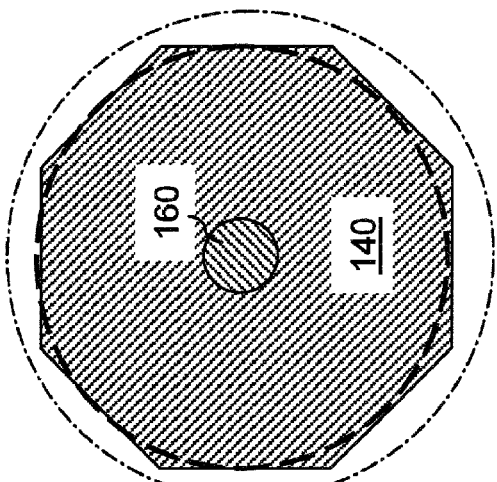
FIG. 3 (Prior Art)
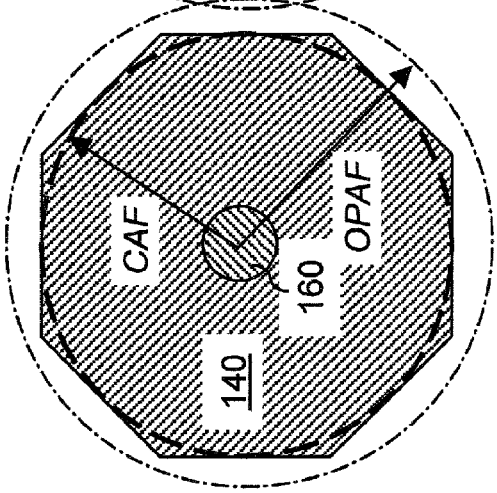

US 8,174,841 B2

ADAPTIVE INTERCONNECT STRUCTURE

FIELD OF THE INVENTION

The present invention relates to semiconductor structures, and particularly to a vertically stacked semiconductor structure including an array of programmable conductive pins and an array of sockets, and methods of manufacturing the same.

BACKGROUND OF THE INVENTION

As continued semiconductor scaling faces difficulties at device dimensions approaching atomic scale, three-dimensional device integration offers a method of increasing semiconductor devices within a circuit. In three-dimensional integration, a plurality of semiconductor chips is vertically stacked to provide integration of semiconductor devices beyond a single semiconductor chip.

One method of providing electrical connection between vertically adjoined semiconductor chips is "flip chip" technology in which an array of solder balls are employed between two adjoined semiconductor chips that are vertically stacked face to face. However, flip chip technology provides electrical connection between only two vertically stacked semiconductor chip.

Another method of providing electric connection between vertically adjoined semiconductor chips employs an array of conductive vias and an array of conductive sockets. In such schemes, wafers or chips are bonded to other wafers or chips so that each conductive pin on a wafer or a chip matches a conductive socket on another wafer or another chip. The minimum pitch of the conductive pins and the conductive sockets, and hence the density of interconnections between the chips or wafers is determined by the alignment accuracy, or overlay tolerance, of the wafer-to-wafer, chip-to-wafer, or chip-to-chip bonding process. Referring to FIG. 1, an exemplary prior art semiconductor structure for forming a vertically stacked semiconductor structure is provided. The exemplary prior art semiconductor structure comprises an upper semiconductor structure 110 and a lower semiconductor structure 190 that are aligned to each other, and brought together for bonding. The upper semiconductor structure 110 includes an upper handle substrate 180, an upper semiconductor substrate 170, an array of conductive pins 160, and upper bonding material portions 155. The lower semiconductor structure 190 includes a lower handle substrate 120, a lower semiconductor substrate 130, an array of conductive sockets 140, and lower bonding material portions 145.

The upper semiconductor substrate 170 includes a set of semiconductor devices electrically connected to the array of the conductive pins 160. The lower semiconductor substrate 130 includes semiconductor devices that are electrically connected to the array of the conductive sockets 140. The upper handle substrate 180 and the lower handle substrate 120 are optional, i.e., may, or may not, be present. By brining the upper semiconductor structure 110 and the lower semiconductor structure 190 together and inducing boding between the upper bonding material portions 155 and the lower bonding material portions 145, electrical connection is provided between the semiconductor devices in the upper semiconductor substrate 170 and the semiconductor devices in the lower semiconductor substrate 130 through the set of electrical contacts including an array of pairs of a conductive pin 160 and a conductive socket 140. The upper bonding material portions 155 and the lower bonding material portions 145 may comprise dielectric materials, polymers, or metallic materials. There is a one-to-one correspondence between the conductive pins 160 and the conductive sockets 140, i.e., the number of the conductive pins 160 is the same as the number of the conductive sockets 140.

Referring to FIG. 2, the relative portion between a neighboring pair of conductive pins 160 and a matching pair of conductive sockets 140 is schematically illustrated. For the purpose illustration, the conductive pins 160 and the conductive sockets 140 are in perfect lateral alignment. The diameter dp of a conductive pin 160 is typically from about 0.5 micron to about 2 microns. The socket may have a shape of a circle or a regular polygon. The distance between a pair of parallel edges of the regular polygon or the diameter of the circle is herein referred to as a lateral socket dimension LSD, which is limited by overlay tolerance of the bonding process employed to bond the upper semiconductor structure 110 with the lower semiconductor structure 190. Lateral socket dimension LSD may be from about 1 micron to about 10 microns, and is typically from about 3 microns to about 6 microns.

Referring to FIG. 3, the effect of overlay variations during bonding on the size of conductive sockets is shown. To provide effective electrical connection between a conductive pin 160 and a conductive socket 140, the center of the conductive pin 160 must be located within the area of the conductive socket 140 that matches the conductive pin 160. Therefore, the shortest distance between the periphery of the conductive socket 140 and the center of the conductive socket 140 must be at least equal to the overlay tolerance of the bonding process. The circular area within which the center of the conductive pin 160 needs to be placed to provide effective electrical connection between the conductive pin 160 and the conductive socket 140 is herein referred to as a "connectivity alignment field" CAF.

If the radius of the connectivity alignment field CAF is greater than the overlay tolerance of the bonding process, the conductive pin 160 always falls within the area of a matching conductive socket 140. If the radius of the connectivity alignment field CAF is less than the overlay tolerance of the bonding process, electrical contact between the conductive pin 160 and the conductive socket 140 has a statistically significant probability of being inadequate, e.g., the conductive pin 160 and the conductive socket 140 may be electrically disconnected or only insufficiently connected.

Since the conductive pin 160 has a finite area, the area that the conductive pin 160 may occupy at a maximum overlay variation extends beyond the area of the connectivity alignment field CAF by the radius of the conductive pin 160. The area that the conductive pin 160 may possibly cover is herein referred to as an "outermost pin alignment field" OPAF. The outermost pin alignment field OPAF has a radius of the sum of the overlay tolerance of the bonding process and the radius of the conductive pin 160. The pitch of the array of the conductive socket 140 is determined by the constraint that the outermost pin alignment field OPAF of a conductive socket 140 may not touch a neighboring conductive socket 140. Therefore, the minimum pitch of the array of the conductive sockets 160 is the sum of twice the overlay tolerance of the bonding process and the diameter of the conductive pin 160. The pitch of the array of the conductive pins 160 is determined by the pitch of the matching array of conductive sockets 140. For a bonding process having an overlay tolerance of about 3 microns and conductive pins 160 having a diameter dp of about 1 micron, the minimum pitch for the array of conductive sockets 140 and the matching array of conductive pins 160 is about 6.5 microns. The pitch of the array of conductive sockets 140 is limited mostly by the overlay tolerance of the bonding process. As long as the exemplary prior art structure is employed for vertically stacking an upper semiconductor structure and a lower semiconductor structure, the density of interconnects between a wafer-to-wafer, chip-to-wafer, or chip-to-chip bonding process is limited by the minimum pitch of an array of conductive sockets, which is limited by the overlay tolerance of the bonding process.

In view of the above, there exists a need to increase the density of interconnections between wafer-to-wafer, chip-to-wafer, or chip-to-chip bonding processes without being limited by the overlay tolerance of the bonding process.

Particularly, there exists a need for reducing the pitch of interconnections in such vertically bonded structures to a dimension less than the overlay variations in the alignment of an upper semiconductor structure and a lower semiconductor structure.

SUMMARY OF THE INVENTION

To address the needs described above, the present invention provides a semiconductor structure including an array of programmable contact pads in which contact pads have a pitch less than twice an overlay tolerance of a bonding process, methods of operating the same.

In the present invention, an array of contact pins is provided on a first semiconductor substrate, which may be incorporated into a first semiconductor structure. An array of contact pads is provided on a second semiconductor substrate, which may be incorporated into a second semiconductor structure. The array of contact pads has a pitch less than twice an overlay tolerance of a bonding process employed to vertically stack the first semiconductor structure and the second semiconductor structure. The array of contact pins has the same pitch as the array of contact pads. A set of contact pads within the area of overlay variation for a matching contact pin may be electrically connected to an array of programmable contacts such that one programmable contact is connected to each contact pad within the area of overlay variation. One contact pad may be provided with a plurality of programmable contacts if the contact pad is located within the area of overlay variation for multiple contact pins. Since the variability of contacts between contact pins and contact pads is accommodated by connecting or disconnecting programmable contacts after the stacking of semiconductor structures, the pitch of the array of contact pins may be less than twice the overlay variation of the bonding process, thereby providing a high density of interconnections in the vertically stacked structure.

According to an aspect of the present invention, a structure is provided, which comprises:

a first semiconductor structure including a first semiconductor substrate comprising at least one semiconductor device;

an array of conductive pins located on the first semiconductor substrate;

a second semiconductor structure including a second semiconductor substrate comprising at least another semiconductor device;

an array of conductive pads located on the second semiconductor substrate; and at least one localized network of programmable contacts connected to a subset of the array of conductive pads.

In one embodiment, each conductive pad in the subset is connected to a programmable contact, and all programmable contacts in the subset are connected to a signal port within the second semiconductor substrate by a parallel connection.

In another embodiment, the first semiconductor structure and the second semiconductor structure are separated from each other, and all programmable contacts in the at least one localized network of programmable contacts are unprogrammed.

In even another embodiment, the array of conductive pins abut the array of conductive pads, wherein at least one first programmable contact in the at least one localized network of programmable contacts is programmed, and at least one second programmable contact in the at least one localized network of programmable contacts is unprogrammed.

In yet another embodiment, each conductive pad electrically connected to the at least one first programmable contact is resistively connected to a signal port, and each conductive pad electrically connected to at least one second programmable contact is electrically disconnected from the signal port.

In still another embodiment, each conductive pad electrically connected to the at least one first programmable contact is resistively connected to a signal port, and wherein each conductive pad electrically connected to at least one second programmable contact is electrically disconnected from the signal port.

In a further embodiment, the at least one localized network of programmable contacts include a plurality of localized networks of programmable contacts, and at least one conductive pad in the array of conductive pads is resistively connected to a first-group programmable contact in a first localized network of programmable contacts and to a second-group programmable contact in a second localized network of programmable contacts.

In an even further embodiment, a plurality of conductive pads in the array of conductive pads is resistively connected to a first-group programmable contact in the first localized network of programmable contacts and to a second-group programmable contact in the second localized network of programmable contacts.

In a yet further embodiment, the array of conductive pins has a first pitch in a direction, wherein the array of conductive pads has a second pitch in the direction, and wherein the first pitch is greater than the second pitch and a first spacing in the direction between a neighboring pair of conductive pins is greater than the second pitch.

In an even further embodiment, the first pitch is greater than the second pitch and is an integer multiple of the second pitch.

According to another aspect of the present invention, another structure is provided, which comprises:

a first semiconductor structure including a first semiconductor substrate comprising at least one semiconductor device;

an array of conductive pins located on the first semiconductor substrate and having a first pitch in a direction;

a second semiconductor structure including a second semiconductor substrate comprising at least another semiconductor device; and an array of conductive pads located on the second semiconductor substrate and having a second pitch in the direction, wherein the first pitch is greater than the second pitch and a first spacing in the direction between a neighboring pair of conductive pins is greater than the second pitch.

In one embodiment, the first pitch is greater than the second pitch and is an integer multiple of the second pitch.

In another embodiment, the array of conductive pins is a first rectangular array or a first hexagonal array having the first pitch in a first direction and a third pitch in a second direction, and wherein the array of conductive pads is a second rectangular array or a second hexagonal array having the second pitch in the first direction and a fourth pitch in the second direction, wherein the third pitch is greater than the fourth pitch, and a second spacing in the second direction between a neighboring pair of conductive pins is greater than the fourth pitch.

In yet another embodiment, the third pitch is greater than the fourth pitch and is an integer multiple of the fourth pitch.

In still another embodiment, the first pitch is greater than a sum of said second pitch and a lateral dimension of a conductive pin.

In a further embodiment, the structure further comprises at least one localized network of programmable contacts located in the second semiconductor substrate and resistively connected to a subset of the array of conductive pads, wherein each programmable contact in the at least one localized network is connected to a conductive pad in a series connection, and all programmable contacts in the at least one localized network is connected is connected to a signal port in a parallel connection.

According to yet another aspect of the present invention, a method of forming a semiconductor structure is provided, which comprises:

providing a first semiconductor structure including a first semiconductor substrate and an array of conductive pins located thereupon, wherein the first semiconductor substrate comprises at least one semiconductor device;

providing a second semiconductor structure including a second semiconductor substrate, an array of conductive pads located thereupon, and at least one localized network of programmable contacts connected to a signal port, wherein the second semiconductor substrate comprises at least another semiconductor device;

vertically stacking and bonding the first semiconductor structure with the second semiconductor structure; and programming at least one first programmable contact in the at least one localized network of programmable contacts, while not programming at least one second programmable contact in the at least one localized network of programmable contacts.

In one embodiment, the at least one localized network of programmable contacts is resistively connected to a subset of the array of conductive pads, wherein each programmable contact in the at least one localized network is connected to a conductive pad in a series connection, and all programmable contacts in the at least one localized network is connected is connected to the signal port in a parallel connection.

In another embodiment, the at least one first programmable contact provides an electrically conductive path between a conductive pad and a signal port, and the at least one second programmable contact electrically disconnects a conductive pad from the signal port.

In even another embodiment, the at least one localized network of programmable contacts include a plurality of localized networks of programmable contacts, and at least one conductive pad in the array of conductive pads is resistively connected to a first-group programmable contact in a first localized network of programmable contacts and to a second-group programmable contact in a second localized network of programmable contacts.

In yet another embodiment, the array of conductive pins has a first pitch in a direction, wherein the array of conductive pads has a second pitch in the direction, and the first pitch is greater than the second pitch and is an integer multiple of the second pitch.

In still another embodiment, the method further comprises laterally aligning the first semiconductor structure and the second semiconductor structure employing a process having an overlay tolerance that is greater than a pitch of the array of conductive pins, wherein each conductive pad resistively connected to the at least one first programmable contact underlies or overlies a conductive pin.

BRIEF DESCRIPTION OF THE DRAWINGS

FIG. 2 is a sec-through top down-view showing lateral alignment of a pair of conductive pins 160 and a matching pair of conductive sockets 140 in the exemplary prior art semiconductor structure.

FIG. 3 is a top-down view illustrating the relationship between overlay tolerance and a minimum pitch for the pair of conductive pins 160 and the matching pair of conductive sockets 140 in the exemplary prior art semiconductor structure.

DETAILED DESCRIPTION OF THE INVENTION

Figure 1:
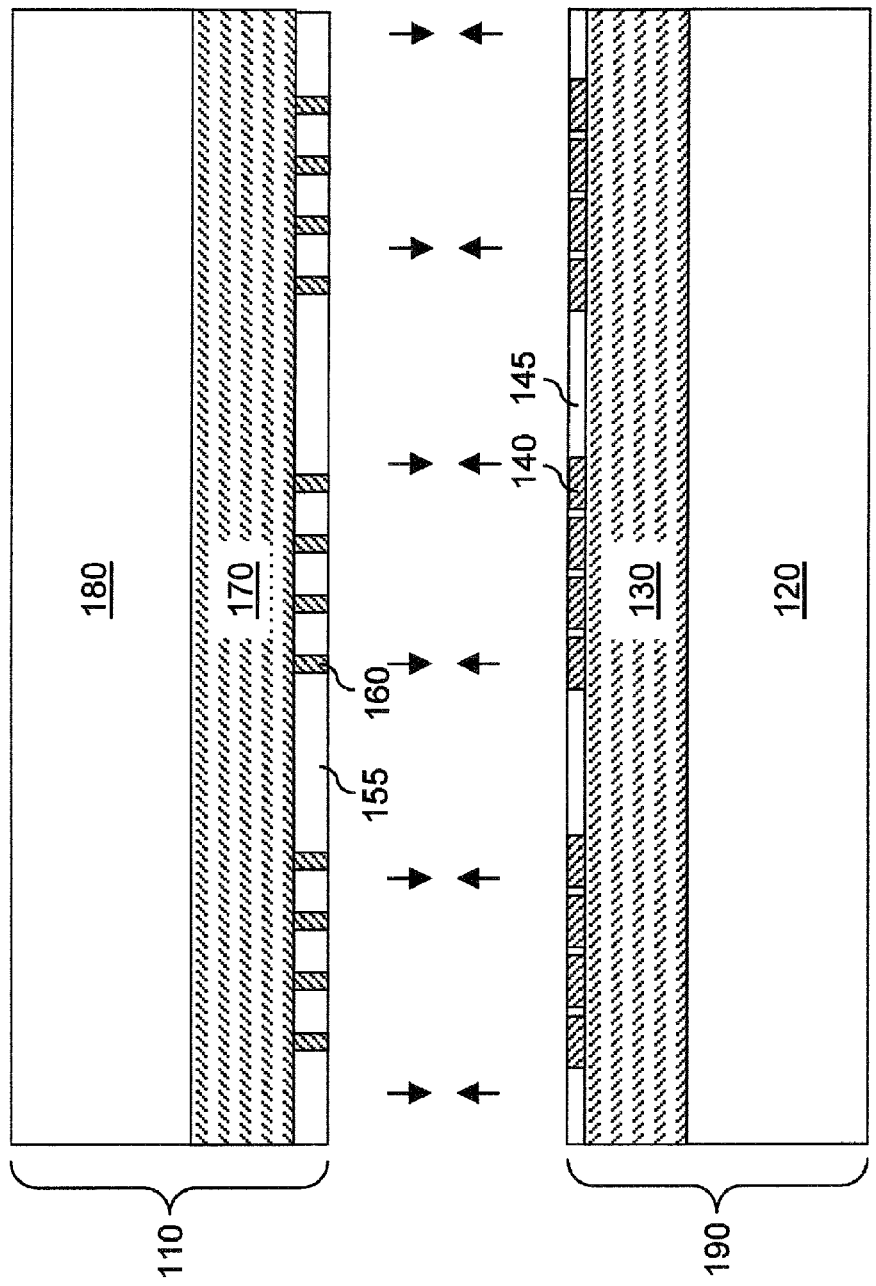
FIG. 1 is a vertical cross-sectional view of an exemplary prior art semiconductor structure.

As stated above, the present invention relates to a vertically stacked semiconductor structure including an array of programmable conductive pins and an array of sockets, and methods of manufacturing the same, which are described herein with accompanying figures. As used herein, when introducing elements of the present invention or the preferred embodiments thereof, the articles "a", "an" "the" and "said" are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Figure 4:
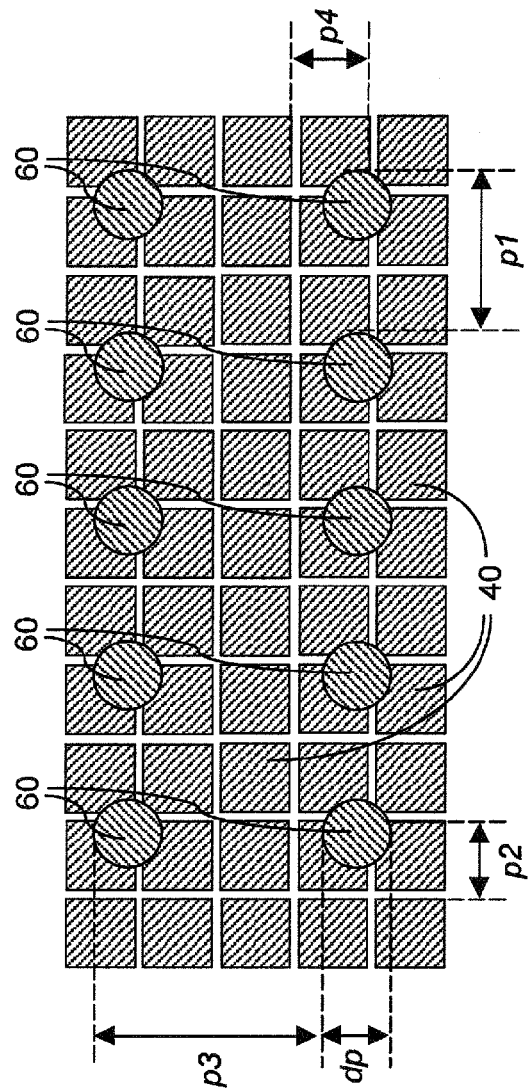
FIG. 4 is a top-down view showing an array of conductive pins 60 and an array of conductive pads 40 according to the present invention.

Referring to FIG. 4, an array of conductive pins 60 and an array of conductive pads 40 are shown according to the present invention. The array of conductive pins 60 may be a rectangular array, a hexagonal array, any other regular two dimensional array having periodicity in two directions, or a one-dimensional regular array having a constant pitch. For the purposes of description of the present invention, the array of conductive pins 60 comprise a rectangular array. Application of the present invention to other configurations of the array of conductive pins 60 is explicitly contemplated herein. Further application of the present invention to an irregular array having variations in the pitch within the array of conductive pads 60 is also explicitly contemplated herein.

Each conductive pin 60 comprises a metallic material such as Cu, Al, W, WN, TaN, TiN, or a combination thereof. The array of conductive pins 60 has a first pitch p1 in a first direction. The first pitch p1 is the periodicity of the array of conductive pins 60 in the first direction. The array of conductive pins 60 has a third pitch p3 in a second direction, which is a different direction from the first direction and may be orthogonal to the first direction. The third pitch p3 is the periodicity of the array of conductive pins 60 in the second direction.

Each conductive pin 60 has a first lateral dimension in the first direction. The first lateral dimension is the maximum separation distance between two peripheral portions of a conductive pin 60 in the first direction. In case the horizontal cross-sectional area of the conductive pin 60 is a circle, the first lateral dimension is the diameter dp of the conductive pin 60. Each conductive pin 60 has a second lateral dimension in the second direction. The second lateral dimension is the maximum separation distance between two peripheral portions of a conductive pin 60 in the second direction. In case the horizontal cross-sectional area of the conductive pin 60 is a circle, the first lateral dimension and the second lateral dimension are the diameter dp of the conductive pin 60.

Each conductive pad 40 comprises a metallic material such as Cu, Al, W, WN, TaN, TiN, or a combination thereof. Each conductive pad 40 may have a circular shape, polygonal shape, a curvilinear shape, or a combination thereof. For example, the conductive pads 40 may have a square shape or a rectangular shape. The array of conductive pads 40 has a periodicity in the first direction and in the second direction. The periodicity in the first direction is herein referred to as a second pitch p2, and the periodicity in the second direction is herein referred to as a fourth pitch p4.

The first pitch p1 and the second pitch p2 are selected to prevent contact of the same conductive pad 40 by more than one contact pin 60. Thus, a first spacing between a neighboring pair of contact pins 60 in the first direction, i.e., the distance between the neighboring pair of contact pins 60 that are separated along the first direction, is greater than the second pitch p2, i.e., the pitch of the array of the conductive pads 40 in the first direction. Since the first pitch p1 is the sum of the first spacing and the first lateral dimension, the first pitch p1 is greater than the sum of the second pitch p2 and the first lateral dimension. In case the conductive pins 60 have a cross-sectional area of a circle, the first pitch p1 is greater than the sum of the second pitch p2 and the diameter dp of a conductive pin 60. Thus, the first pitch p1 is greater than the second pitch p2, and the first spacing in the direction between a neighboring pair of conductive pins is greater than the second pitch p2.

Likewise, the third pitch p3 and the fourth pitch p4 are selected to prevent contact of the same conductive pad 40 by more than one contact pin 60. Thus, a second spacing between a neighboring pair of contact pins 60 in the second direction, i.e., the distance between the neighboring pair of contact pins 60 that are separated along the second direction, is greater than the fourth pitch p4, i.e., the pitch of the array of the conductive pads 40 in the second direction. Since the second pitch p1 is the sum of the second spacing and the second lateral dimension, the third pitch p3 is greater than the sum of the fourth pitch p4 and the second lateral dimension. In case the conductive pins 60 have a cross-sectional area of a circle, the third pitch p3 is greater than the sum of the fourth pitch p4 and the diameter dp of a conductive pin 60. Thus, the third pitch p3 is greater than the fourth pitch p4, and a second spacing in the second direction between a neighboring pair of conductive pins is greater than the fourth pitch p4.

In case the array of the conductive pins 60 is a first rectangular array or a first hexagonal array having the first pitch p1 in a first direction and the third pitch p3 in a second direction, the array of the conductive pads 40 may be a second rectangular array or a second hexagonal array having the second pitch p2 in the first direction and the fourth pitch p4 in the second direction.

In one embodiment, the first pitch p1 may be an integer multiple of the second pitch p2 so that the pattern of overlapping areas between a set of contacting pairs of a conductive pin 60 and a conductive pad 40 is repetitive in the first direction. In another embodiment, the third pitch p3 may be an integer multiple of the fourth pitch p4 so that the pattern of overlapping areas between a set of contacting pairs of a conductive pin 60 and a conductive pad 40 is repetitive in the second direction. In yet another embodiment, the first pitch p may be an integer multiple of the second pitch p2 and the third pitch p3 may be an integer multiple of the fourth pitch p4.

Figure 5:
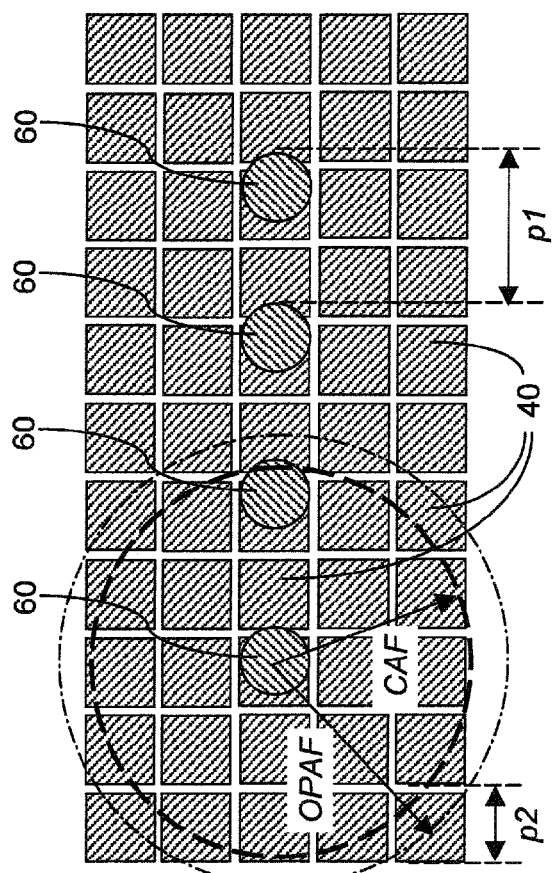
FIG. 5 is a top-down view illustrating the relationship between overlay tolerance, a first pitch p1 of the array of conductive pins 60, and a second pitch p2 of the array of conductive pads 40 according to the present invention.

Referring FIG. 5, the relationship is shown among the overlay tolerance of the process that is employed to laterally align the array of the conductive pins 60 to the array of the conductive pads 40, a first pitch p1 of the array of the conductive pins 60, and a second pitch p2 of the array of conductive pads 40. For any given conductive pin 60, e.g., for the conductive pin 60 located at the center of two concentric circles in FIG. 5, the entirety of the area at which the center of the conductive pin 60 may be located is covered with a subset of the array of the conductive pads 40. The circular area within which the center of the conductive pin 60 may possibly be placed employing the lateral alignment process that brings the array of the conductive pins 60 with the array of the conductive pads 40 is thus a connectivity alignment field CAF. For any given conductive pin 60, effective electrical connection between the conductive pin 60 and at least one of the conductive pads 40 within the array of the conductive pads 40. Therefore, the connectivity alignment field CAF is the same as the area of overlay tolerance of the lateral alignment process that a first semiconductor structure (not shown) that includes the array of the conductive pins 40 and a second semiconductor structure (not shown) that includes the array of the conductive pads 60. In other words, for any given conductive pin 60, effective electrical connection between the conductive pin 60 and at least one of the conductive pads 40 is assured irrespective of the overlay tolerance of the alignment process that is employed to laterally align the first semiconductor structure and the second semiconductor structure.

In contrast with the limitations on the distance between the periphery of the conductive socket 140 and the center of the conductive socket 140 in FIG. 3 of the prior art structure described above, the second pitch p2 is not limited by, and may be less than, twice the overlay tolerance of the alignment process, which is equal to the radius of the connectivity alignment field CAF in FIG. 5. Likewise, the fourth pitch p4 is not limited by, and may be less than, twice the overlay tolerance of the alignment process. For any conductive pin 60, electrical contact between a predefined and pre-designated conductive pad 40 is not required. Instead, the present invention allows electrical contact between a conductive pin 60 and at least one of a subset of the conductive pads 40 within the area defined by the connectivity alignment field CAF. Upon determination of the at least one conductive pad 40 within the subset that makes electrical contact with the conductive pin 60, a localized network (not shown) of programmable contacts is programmed to enable electrical connection between the conducive pin 40 and the at least one conductive pad 40 which makes actual electrical contact, viz. resistive contact, with the conductive pin 40.

Since the conductive pin 60 has a finite area, the area that the conductive pin 60 may occupy at a maximum overlay variation extends beyond the area of the connectivity alignment field CAF by the a dimension determined by the combination of the first lateral dimension and the second lateral dimension of the conductive pin 60. The area that the conductive pin 60 may possibly cover is an outermost pin alignment field OPAF. For example, if the conductive pin 60 has a circular cross-sectional area, the outermost pin alignment field OPAF has a radius of the sum of the overlay tolerance of the bonding process and the radius of the conductive pin 60.

Unlike the prior art structure of FIG. 3 in which no other conductive pin 160 or no other conductive socket 140 may be located within the outermost pin alignment field OPAF of any given conductive socket 140, a plurality of conductive pads 40 may be present within the outermost pin alignment field OPAF corresponding to any particular conductive pin 60 in the present invention. Further, one or more conductive pins 60 may be present within the outermost pin alignment field OPAF corresponding to the conductive pin 60. The first through fourth pitches (p1-p4) are not affected by the overlay tolerance of the lateral alignment. Therefore, the present invention allows laterally alignment of a first semiconductor structure including the array of the conductive pins 40 and a second semiconductor structure including the array of the conductive pads 60 employing a process having an overlay tolerance that is greater than the first pitch p1 and/or the third pitch p3 of the array of the conductive pins 40.

The limitations on the dimensions of the first through fourth pitches (p1-p4) are instead given by the condition that two conductive pins 40 may not contact the same conductive pad 40. Thus, the first spacing between a neighboring pair of conductive pins 40 in the first direction is greater than the second pitch p2, and the second spacing between a neighboring pair of conductive pins 40 in the second direction is greater than the fourth pitch p4. Correspondingly, the first pitch p1 in the first direction is greater than the sum of the second pitch p2 and the first lateral dimension of a conductive pin 40, and the third pitch p3 in the second direction is greater than the sum of the fourth pitch p4 and the second lateral dimension of the conductive pin 40. In case the conductive pin 40 has a circular cross-sectional area, the first lateral dimension and the second lateral dimension may be the diameter dp of the conducive pin 40 (See FIG. 4).

For example, if an overlay process having an overlay tolerance from about 1 micron to about 10 microns is employed to vertically stack a first semiconductor structure including an array of conductive pins 40 and a second semiconductor structure including an array of conductive vias 60, and if the conductive pins 40 in the array of conductive pins 40 has a diameter from about 0.1 micron to about 2 microns, the first pitch p1 may be from about 0.2 micron to about 3 microns, and the third pitch p3 may be from about 0.2 micron to about 3 microns.

Figure 6:
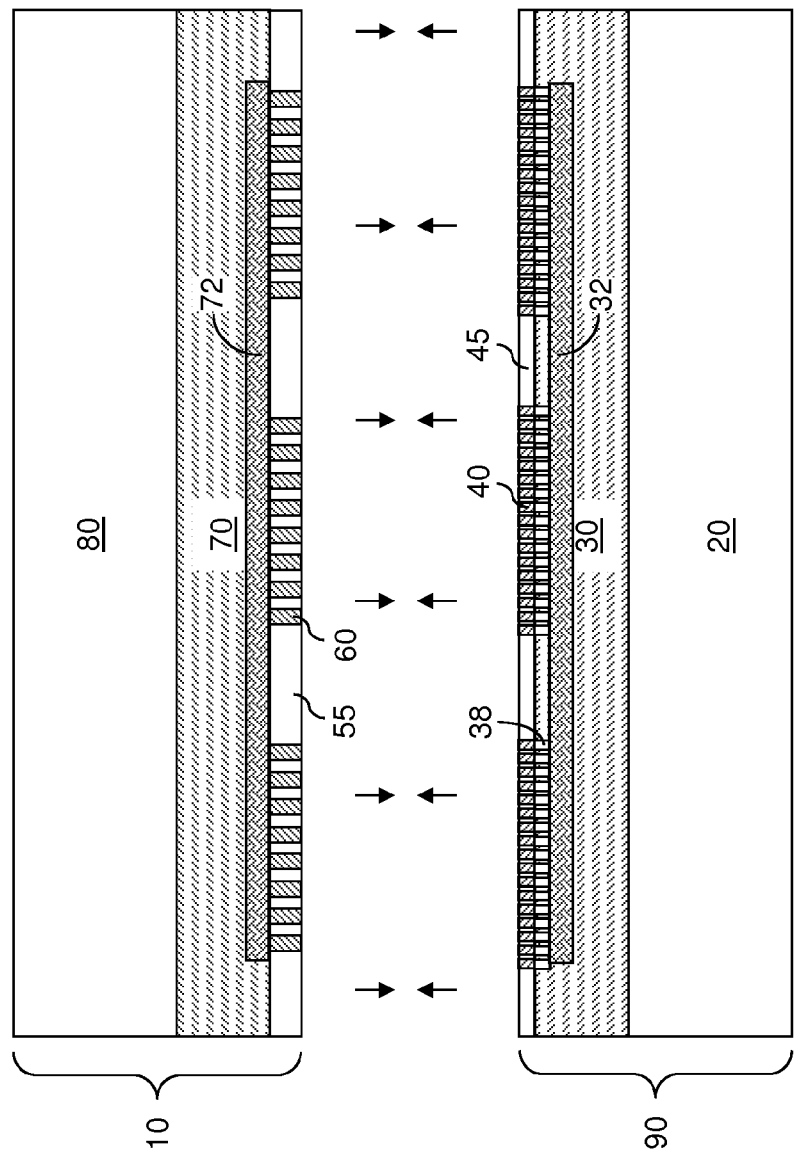
FIG. 6 is a vertical cross-sectional view of an exemplary semiconductor structure according to the present invention.

Referring to FIG. 6, an exemplary semiconductor structure for forming a vertically stacked semiconductor structure according to the present invention is shown. The exemplary semiconductor structure comprises a first semiconductor structure 10 and a second semiconductor structure 90 that are aligned to each other, and brought together for bonding. The first semiconductor structure 10 includes a first handle substrate 80, a first semiconductor substrate 70, an array of conductive pins 60, and first bonding material portions 55. The second semiconductor structure 90 includes a second handle substrate 20, a second semiconductor substrate 30, an array of conductive pads 40, and second bonding material portions 45. The upper bonding material portions 55 may be formed as a contiguous upper bonding material layer of unitary and integral construction so that the array of conductive pins 60 is embedded in the contiguous upper bonding material layer. Likewise, the lower bonding material portions 45 may be formed as a contiguous lower bonding material layer of unitary and integral construction so that the array of conductive pads 40 is embedded in the contiguous lower bonding material layer.

The first semiconductor substrate 70 includes a set of semiconductor devices 72 electrically connected to the array of the conductive pins 60. The second semiconductor substrate 30 includes semiconductor devices 32 that are electrically connected to the array of the conductive pads 40. The first handle substrate 80 and the second handle substrate 20 are optional, i.e., may, or may not, be present. If employed, the first handle substrate 80 and the second handle substrate 20 provide mechanical strength to the first semiconductor structure 10 and the second semiconductor structure, respectively. The first handle substrate 80 and the second handle substrate 20 may comprise glass, dielectric oxide, and/or a semiconductor material. The thickness of the first semiconductor structure 10 and the second semiconductor structure 90 may be from about 500 microns to about 1,200 microns, although lesser and greater thicknesses are also contemplated herein. The thickness of the first semiconductor substrate 70 and the second semiconductor substrate 30 may be from about 10 microns to about 900 microns, although lesser and greater thicknesses are also contemplated herein.

By laterally aligning and brining the first semiconductor structure 10 and the second semiconductor structure 90 together and inducing boding between the first bonding material portions 55 and the second bonding material portions 45, electrical connection is provided between the semiconductor devices 72 in the first semiconductor substrate 70 and the semiconductor devices 32 in the second semiconductor substrate 30 through the set of electrical contacts including an array of the conductive pins 60 and the array of the conductive pads 40. The first bonding material portions 55 and the second bonding material portions 45 may comprise dielectric materials, polymers, or metallic materials. The number of the conductive pads 40 is greater than the number of the conductive pins 60. The ratio of the number of the conductive pads 40 to the number of the conductive pins 60 is greater than 1.0, and is typically greater than 1.1, and is more typically greater than 2.0, and most typically greater than 4.0. In some embodiments, the ratio may be one the order of 10 or 100 or even greater.

Programmable contacts 38 are provided within the second semiconductor substrate 30. In one embodiment, one end of each of the programmable contacts 38 is serially connected to one of the conductive pads 40. Each electrical connection between a programmable contact 38 and a conductive pad 40 is resistive. Some conductive pads 40 may be resistively connected with a plurality of the programmable contacts 38. Some other conductive pads 40 may be resistively connected with a single programmable contact 38. The opposite end of each of the programmable contact 38, i.e., the end that is not resistively connected to a conductive pad 40, is connected to a signal port. The electrical connection of the programmable contacts 38 to the signal port constitutes a localized network of programmable contacts 38.

In another embodiment, conductive pads 40 that are not electrically connected to a programmable contact 38 may be employed. In this case, the conductive pads 40 may be directly connected to an electrical port such as a power port.

Figure 7:
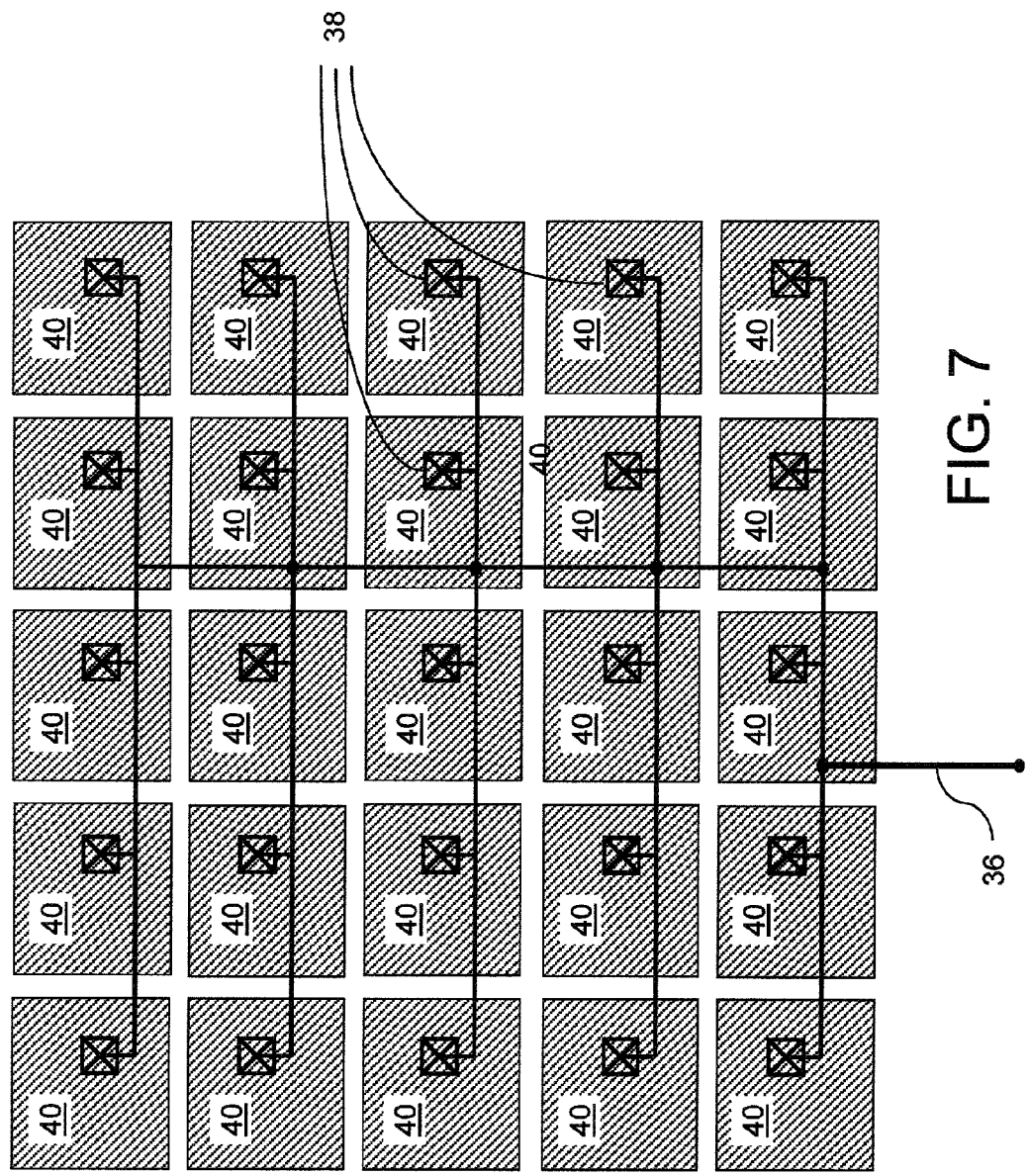
FIG. 7 is a top-down view of an array of conductive pads 40 and programmable contacts 38 juxtaposed with a schematic for electrical wiring structures 36 to a signal port.

Referring to FIG. 7, a top-down view of an array of conductive pads 40 and programmable contacts 38 is juxtaposed with a schematic for electrical wiring structures 36 to a signal port. The programmable contacts 38 and the electrical wiring structures 36 collectively constitute a localized network (36, 38) of programmable contacts 38. The localized network (36, 38) may be resistively connected to a subset of an array of conductive pads 40, which may include additional conductive pads 40 that are not connected to the localized network (36, 38).

Each conductive pad 40 in the subset of the array of the conductive pads 40 that belong to the localized network (36, 38) is connected to a programmable contact 38. Each programmable contact 38 in the localized network (36, 38) is connected to a conductive pad 40 in a series connection. All programmable contacts 38 in the subset are connected to a signal port within the second semiconductor substrate 30 (See FIG. 6) by a parallel connection.

Each programmable contact 38 comprises a physical structure that may provide electrical connection or electrical disconnection between two nodes. For example, the programmable contacts 38 in the localized network (36, 38) of programmable contacts 38 comprises at least one of an electrically programmable fuse (eFuse), an electrically programmable antifuse, a field programmable gate array (FPGA), programmable gate array (PGA), programmable read only memory (PROM), erasable programmable read only memory (EPROM), electrically programmable read only memory (EEPROM), and any other programmable logic device (PLD).

In one embodiment, the unprogrammed state of a programmable contact 38 provides an electrical open, while the programmed state of the programmable contact 38 provides an electrical short. Such electrical properties may be provided, for example, by an electrically programmable antifuse. In another embodiment, the unprogrammed state of a programmable contact 38 provides electrical short, while the programmed state of the programmable contact 38 provides an electrical open. Such electrical properties may be provided, for example, by an electrically programmable fuse.

Referring back to FIG. 6, when the first semiconductor structure 10 and the second semiconductor structure 90 are separated from each other prior to vertical stacking and bonding, all programmable contacts 38 in the localized network (36, 38) of programmable contacts 38 are unprogrammed. Once the first semiconductor structure 10 and the second semiconductor structure 90 are laterally aligned and vertically bonded, the array of the conductive pins 40 abut the array of the conductive pads 60, thereby providing signal paths between the first semiconductor structure 10 and the second semiconductor structure 90.

Figure 8:
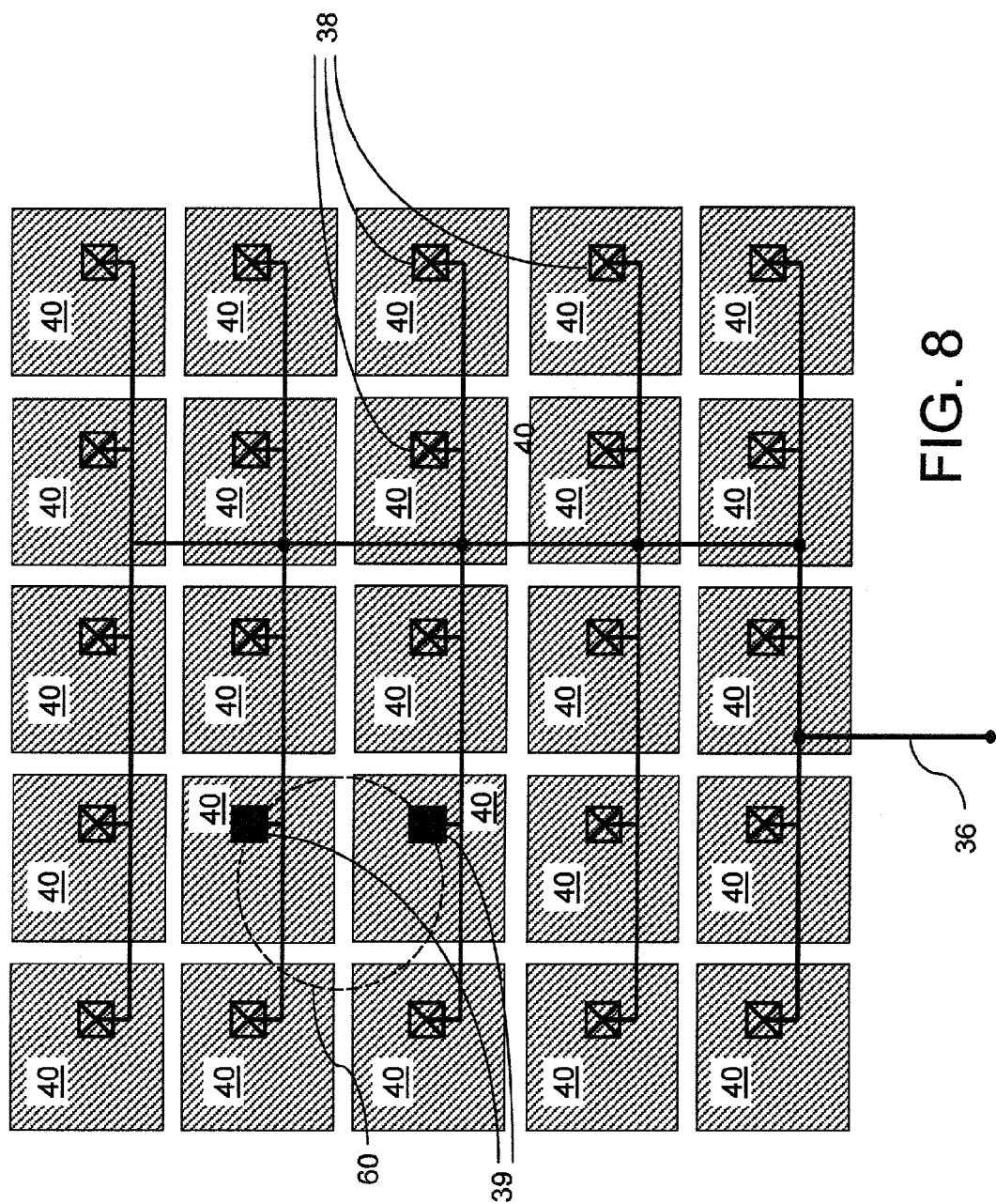
FIG. 8 is a top-down view of an array of conductive pads 40 and programmable contacts 38 on which the position of a conductive pin 60 is overlaid. A schematic for electrical wiring structures 36 to a signal port is juxtaposed with the top-down view.

Referring to FIG. 8, upon bonding of the first semiconductor structure 10 and the second semiconductor structure 90, at least one first programmable contact in the localized network (36, 38) of programmable contacts 38 is programmed. At least one second programmable contact in the localized network (36, 38) of programmable contacts 38 remains unprogrammed.

In case programmable contacts 38 provide an electrical open in an unprogrammed state, the at least one first programmable contact that becomes programmed is located directly underneath or above a conductive pin 60 (represented by a dotted circle). In this case, the at least one second programmable contact that remains unprogrammed is located outside the area of the conductive pin 60 or has an overlap with the conductive pin 60 only at a small fraction of the area of each of the at least one second programmable contact, e.g., less than 50%, and typically less than 25%, of the area of each of the at least one second programmable contact. In this case, the at least one first conductive pad is resistively connected to the conductive pin 60, and is herein referred to as at least one shorted programmable contact 39. Each conductive pad 40 resistively connected to the at least one first programmable contact underlies or overlies the conductive pin 40. Each conductive pad 40 that is electrically connected to the at least one first programmable contact is resistively connected to the signal port through the electrical wiring structure 36, and each conductive pad 40 that is electrically connected to at least one second programmable contact is electrically disconnected from the signal port.

In case programmable contacts 38 provide an electrical short in an unprogrammed state, the at least one first programmable contact that becomes programmed is located outside the area of a conductive pin 60 (represented by a dotted circle) or has an overlap with the conductive pin 60 only at a small fraction of the area of each of the at least one second programmable contact, e.g., less than 50%, and typically less than 25%, of the area of each of the at least one second programmable contact. In this case, the at least one second programmable contact that remains unprogrammed is located directly underneath or above the conductive pin 60. The at least one second conductive pad is resistively connected to the conductive pin 60, and is herein referred to as at least one shorted programmable contact 39. Each conductive pad 40 resistively connected to the at least one second programmable contact underlies or overlies the conductive pin 40. Each conductive pad 40 that is electrically connected to the at least one second programmable contact is resistively connected to the signal port through the electrical wiring structure 36, and each conductive pad 40 that is electrically connected to at least one first programmable contact is electrically disconnected from the signal port.

The unpredictability of the identity of conductive pads 40 to be electrically connected by bonding while employing a lateral alignment process having an overlay tolerance that exceeds the dimensions of an individual conductive pad 40 is solved by programming at least one first programmable contact in the localized network (36, 38) of programmable contacts 38, while not programming at least one second programmable contact in the localized network (36, 38) of programmable contacts 38. The programmable contacts 38 in the localized network (36, 38) are connected to each and every conductive pad 40 that a matching conductive pin 40 may make a physical contact with. Once the programming of all of the programmable contacts 38 is performed, each of the at least one first programmable contact provides an electrically conductive path between a conductive pad 40 and a signal port, and each of the at least one second programmable contact electrically disconnects a conductive pad 40 from the signal port. Each conductive pad 40 that is electrically connected to the at least one first programmable contact is resistively connected to the signal port, and each conductive pad 40 that is electrically connected to at least one second programmable contact is electrically disconnected from the signal port. The location of the at least one shorted programmable contact 39 varies with the overlay between the first and second semiconductor structures (10, 90), and underlies or overlies the conductive pin 60.

Figure 9:
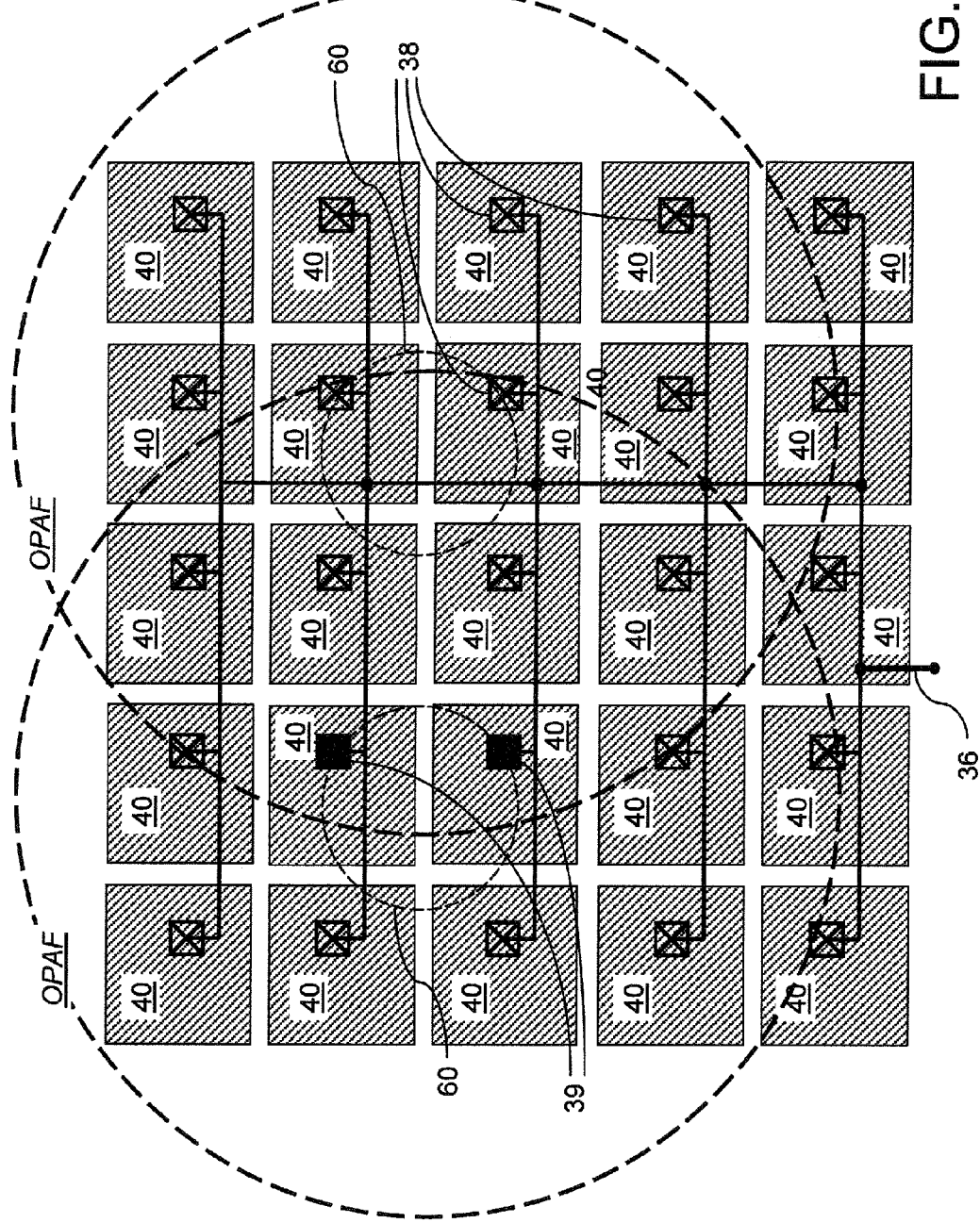
FIG. 9 is a top-down view of an array of conductive pads 40 and programmable contacts 38 on which the positions of a pair of conductive pins 60 are overlaid. A schematic for electrical wiring structures 36 to a signal port is juxtaposed with the top-down view.

Referring to FIG. 9, when the first pitch p1 or the third pitch p3 is less than the outermost pin alignment field OPAF as shown in FIG. 5 and described above, the conductive pin 40 to contact a conductive pad 40 may not be identifiable until the bonding of the first and second semiconductor structures (10, 90) takes place (See FIG. 6). In general, therefore, a conductive pad 40 may be connected to one of a plurality of conductive pins 60 having an outermost pin alignment field OPAF that overlaps with the conductive pad 40.

Figure 10:
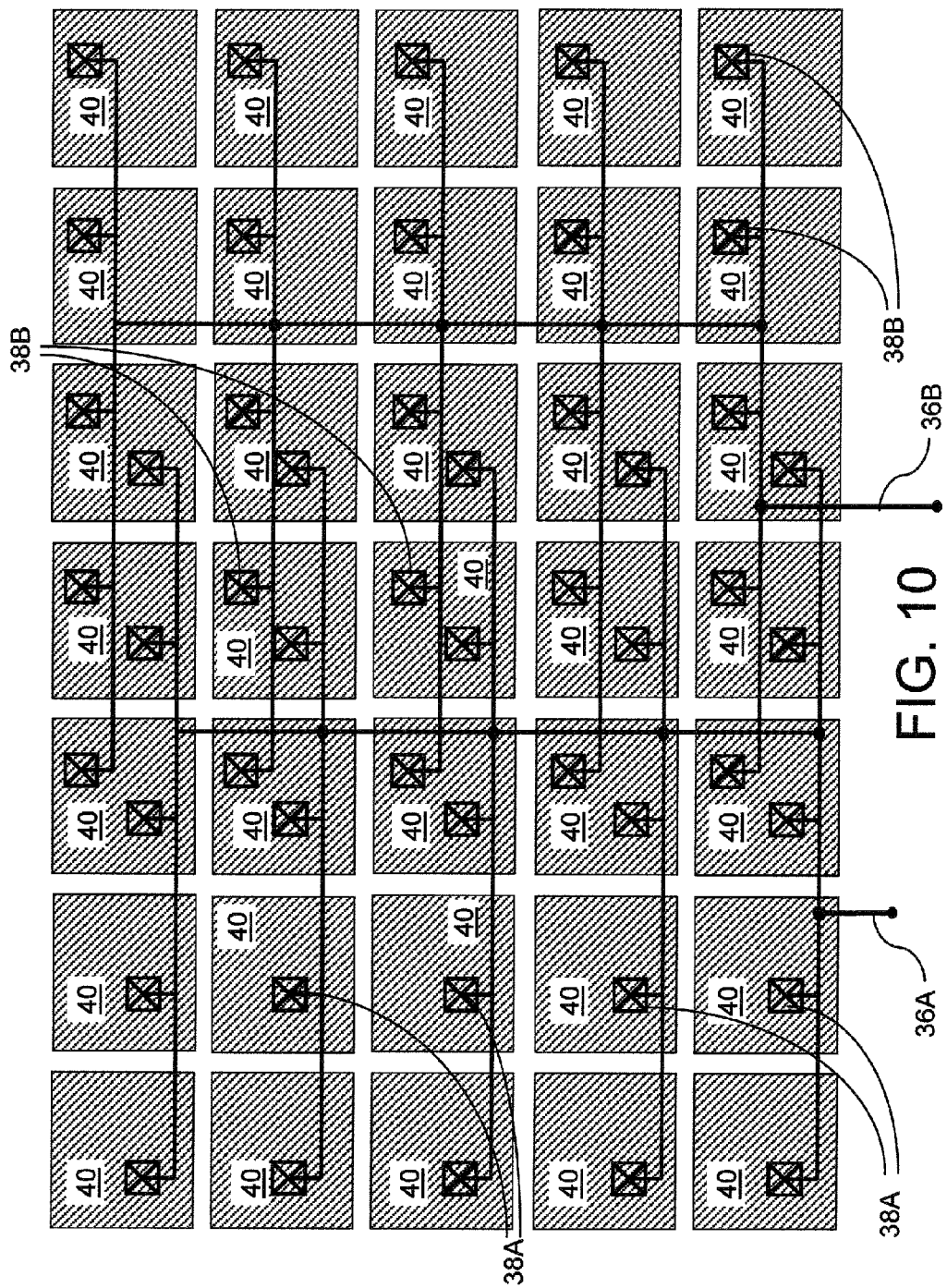
FIG. 10 is a top-down view of an array of conductive pads 40 and programmable contacts (38A, 38B) juxtaposed with a schematic for electrical wiring structures (36A, 36B) to signal ports.

Referring to FIG. 10, to enable electrical connections to the plurality of conductive pins 60 having an outermost pin alignment field OPAF that overlaps with the conductive pad 40, the conductive pads 40 may be provided with resistive electrical connections to a plurality of programmable contacts. For example, fifteen of the conductive pads 40 in FIG. 10 is provided with a first-group programmable contact 38A and a second-group programmable contact 38B corresponding to the overlap of the two outermost pin alignment fields OPAF of two conductive pins 60 shown in FIG. 9. The fifteen of the conductive pads 40 in FIG. 10 are resistively connected to a first localized network of the first-group programmable contacts 38A and a first electrical wiring structure 36A and a second localized network of the second-group programmable contacts 38B and a second electrical wiring structure 36B. The programming mode of the first-group programmable contacts 38A and the second-group programmable contacts 38B that are connected to the fifteen of the conductive pads 40 is determined based on the actual physical location of the contact pins 60 after the bonding of the first and second semiconductor structures (10, 90; See FIG. 6).

Figure 11:
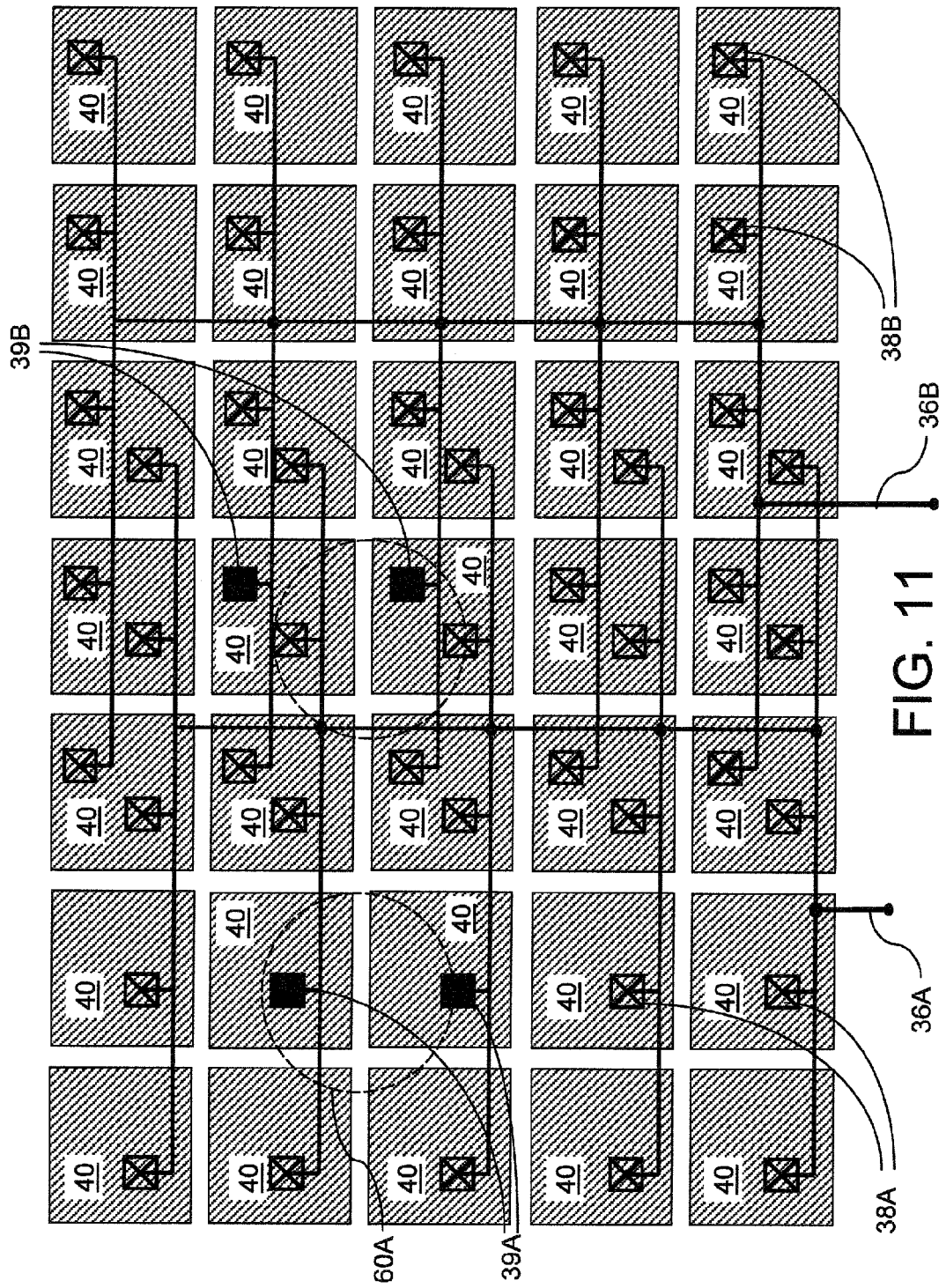
FIG. 11 is a top-down view of an array of conductive pads 40 and programmable contacts (38A, 38B) on which the positions of a pair of conductive pins (60A, 60B) are overlaid. A schematic of electrical wiring structures (36A, 36B) to signal ports is juxtaposed with the top-down view.

Referring to FIG. 11, if the overlay between the first and second semiconductor structures (10, 20) is such that a first contact pin 60A is located outside the area of the contact pads 40 having both the first-group programmable contacts 38A and the second-group programmable contacts 38B, while a second contact pin 60B is located inside the area of the contact pads 40 having both the first-group programmable contacts 38A and the second-group programmable contacts 318B, the second-group programmable contacts 318B overlying or underlying the second contact pin 60B become at least one second shorted programmable contact 39B, which are electrically shorted to provide a resistive connection between the second contact pin 60B and the second electrical wiring structure 36B. The rest of the second-group programmable contacts 38B maintain an electrical open or forms an electrical open.

All of the first-group programmable contacts 38B connected to the contact pads 40 having both the first-group programmable contacts 38A and the second-group programmable contacts 3813 maintain an electrical open or forms an electrical open. At least one of the first-group programmable contacts 38A which are not connected to the fifteen conductive pads 40, i.e., the conductive pads 40 that are connected to the first-group programmable contacts 38A and not connected to the second-group programmable contacts 38B, become at least one first shorted programmable contact 39A, which are electrically shorted to provide a resistive connection between the firsts contact pin 60A and the first electrical wiring structure 36A. The rest of the first-group programmable contacts 38A which are not connected to the fifteen conductive pads 40 maintain an electrical open or forms an electrical open.

In this case, a plurality of localized networks of programmable contacts (38A, 38B) is provided within the second semiconductor substrate 30 (See FIG. 6). At least one conductive pad 40 in the array of conductive pads is resistively connected to a first-group programmable contact 38A in the first localized network of programmable contacts and to a second programmable contact 38B in the second localized network of programmable contacts. A plurality of conductive pads 40 in the array of conductive pads 40 may be resistively connected to a first programmable contact in the first localized network of programmable contacts and to a second programmable contact in the second localized network of programmable contacts.

Embodiments in which the number of programmable contacts connected to a contact pad 40 is greater than two are explicitly contemplated herein.

Figure 12:
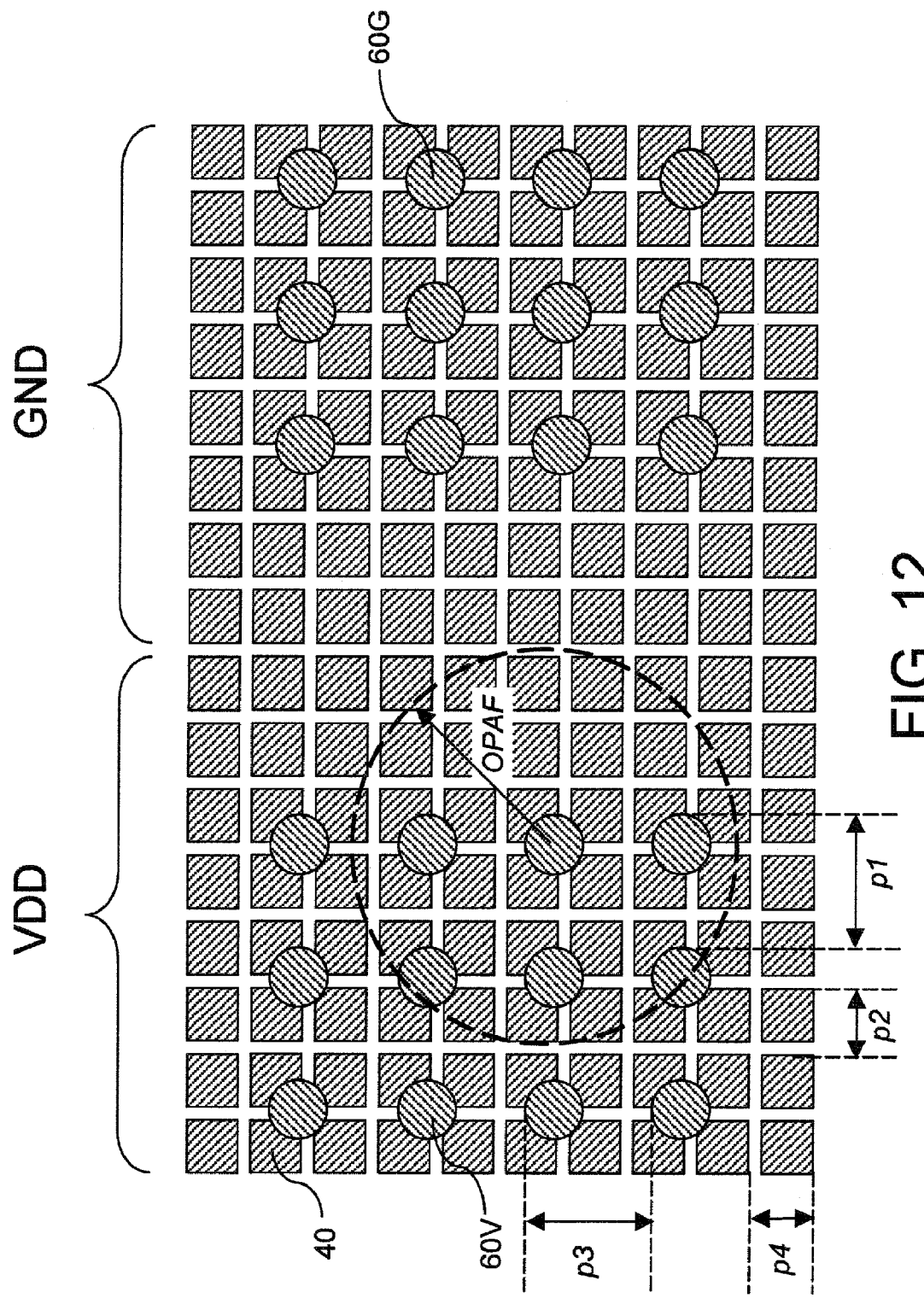
FIG. 12 is a top-down view of the array of conductive pads 40 and arrays of conductive pins (60V, 60G) that are employed for a power network and a ground network.

Referring to FIG. 12, contact pads 40 that are not connected to a network of programmable contacts 38 may be employed in conjunction with, or in lieu of, contact pads 40 that are electrically connected with at least one localized network of programmable contacts 38 (See FIGS. 7-11). For example, a first array of power supply conductive pins 60V may be clustered in a power supply pin area VDD on a second semiconductor substrate (See FIG. 6), and a second array of electrical ground conductive pins 60G may be clustered in an electrical ground pin area GND of the second semiconductor substrate. By confining the outermost pin alignment fields OPAF of the power supply conductive pins 60V within the power supply pin area VDD, while confining the outermost pin alignment fields OPAF of the electrical ground conductive pins 60G within electrical ground pin area GND, the placement of the power supply conductive pins 60V within the power supply pin area VDD and the placement of the electrical ground conductive pins 60G within electrical ground pin area GNU are assured without employing programmable contacts. a top-down view of the array of conductive pads 40 and arrays of conductive pins (60V, 60G) that are employed for a power network and a ground network. The relationships between a first pitch p1, a second pitch p2, a third pitch p3, a fourth pitch p4 are the same as described above for FIGS. 4 and 5.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A structure comprising:
   a first semiconductor structure including a first semiconductor substrate comprising at least one semiconductor device;
   an array of conductive pins located on said first semiconductor substrate;
   a second semiconductor structure including a second semiconductor substrate comprising at least another semiconductor device;
   an array of conductive pads located on said second semiconductor substrate; and
   at least one localized network of programmable contacts connected to a subset of said array of conductive pads, wherein said array of conductive pins abut said array of conductive pads, wherein at least one first programmable contact in said at least one localized network of programmable contacts is programmed, and wherein at least one second programmable contact in said at least one localized network of programmable contacts is unprogrammed.

2. The structure of claim 1, wherein each conductive pad in said subset is connected to a programmable contact, and wherein all programmable contacts in said subset are connected to a signal port within said second semiconductor substrate by a parallel connection.

3. The structure of claim 1, wherein said first semiconductor structure and said second semiconductor structure are separated from each other, and wherein all programmable contacts in said at least one localized network of programmable contacts are in an unprogrammed state.

4. The structure of claim 1, wherein each conductive pad electrically connected to said at least one first programmable contact is resistively connected to a signal port, and wherein each conductive pad electrically connected to at least one second programmable contact is electrically disconnected from said signal port.

5. The structure of claim 4, wherein each conductive pad resistively connected to said at least one first programmable contact underlies or overlies a conductive pin.

6. The structure of claim 1, wherein said at least one localized network of programmable contacts include a plurality of localized networks of programmable contacts, and wherein at least one conductive pad in said array of conductive pads is resistively connected to a first-group programmable contact in a first localized network of programmable contacts and to a second-group programmable contact in a second localized network of programmable contacts.

7. The structure of claim 6, wherein a plurality of conductive pads in said array of conductive pads is resistively connected to a first-group programmable contact in said first localized network of programmable contacts and to a second-group programmable contact in said second localized network of programmable contacts.

8. The structure of claim 1, wherein programmable contacts in said at least one localized network of programmable contacts comprises at least one of an electrically programmable fuse (eFuse), an electrically programmable antifuse, a field programmable gate array (FPGA), programmable gate array (PGA), programmable read only memory (PROM), erasable programmable read only memory (EPROM), electrically programmable read only memory (EEPROM), and any other programmable logic device (PLD).

9. The structure of claim 1, wherein said array of conductive pins and said array of conductive pads comprise a metallic material.

10. A structure comprising:
a first semiconductor structure including a first semiconductor substrate comprising at least one semiconductor device;
an array of conductive pins located on said first semiconductor substrate;
a second semiconductor structure including a second semiconductor substrate comprising at least another semiconductor device;
an array of conductive pads located on said second semiconductor substrate; and
at least one localized network of programmable contacts connected to a subset of said array of conductive pads, wherein said array of conductive pins abut said array of conductive pads, wherein said array of conductive pins has a first pitch in a direction, wherein said array of conductive pads has a second pitch in said direction, and wherein the first pitch is greater than the second pitch and a first spacing in the direction between a neighboring pair of conductive pins is greater than the second pitch.

11. The structure of claim 10, wherein said first pitch is from about 0.2 micron to about 3 microns, and wherein conductive pins in said array of conductive pins has a diameter from about 0.1 micron to about 2 microns.

12. The structure of claim 10, wherein each conductive pad in said subset is connected to a programmable contact, and wherein all programmable contacts in said subset are connected to a signal port within said second semiconductor substrate by a parallel connection.

13. The structure of claim 10, wherein said first semiconductor structure and said second semiconductor structure are separated from each other, and wherein all programmable contacts in said at least one localized network of programmable contacts are unprogrammed.

14. The structure of claim 10, wherein at least one first programmable contact in said at least one localized network of programmable contacts is programmed, and wherein at least one second programmable contact in said at least one localized network of programmable contacts is unprogrammed.

15. The structure of claim 10, wherein each conductive pad electrically connected to said at least one first programmable contact is resistively connected to a signal port, and wherein each conductive pad electrically connected to at least one second programmable contact is electrically disconnected from said signal port.

16. The structure of claim 15, wherein each conductive pad resistively connected to said at least one first programmable contact underlies or overlies a conductive pin.

17. The structure of claim 10, wherein said at least one localized network of programmable contacts include a plurality of localized networks of programmable contacts, and wherein at least one conductive pad in said array of conductive pads is resistively connected to a first-group programmable contact in a first localized network of programmable contacts and to a second-group programmable contact in a second localized network of programmable contacts.

18. The structure of claim 10, wherein programmable contacts in said at least one localized network of programmable contacts comprises at least one of an electrically programmable fuse (eFuse), an electrically programmable antifuse, a field programmable gate array (FPGA), programmable gate array (PGA), programmable read only memory (PROM), erasable programmable read only memory (EPROM), electrically programmable read only memory (EEPROM), and any other programmable logic device (PLD).

19. The structure of claim 10, wherein said array of conductive pins and said array of conductive pads comprise a metallic material.

20. A structure comprising:
a first semiconductor structure including a first semiconductor substrate comprising at least one semiconductor device;
an array of conductive pins located on said first semiconductor substrate and having a first pitch in a direction;
a second semiconductor structure including a second semiconductor substrate comprising at least another semiconductor device; and
an array of conductive pads located on said second semiconductor substrate and having a second pitch in said direction, wherein said first pitch is greater than said second pitch and a first spacing in said direction between a neighboring pair of conductive pins is greater than said second pitch.

21. The structure of claim 20, wherein said array of conductive pins is a first rectangular array or a first hexagonal array having said first pitch in a first direction and a third pitch in a second direction, and wherein said array of conductive pads is a second rectangular array or a second hexagonal array having said second pitch in said first direction and a fourth pitch in said second direction, wherein said third pitch is greater than said fourth pitch, and wherein a second spacing in said second direction between a neighboring pair of conductive pins is greater than said fourth pitch.

22. The structure of claim 20, further comprising at least one localized network of programmable contacts located in said second semiconductor substrate and resistively connected to a subset of said array of conductive pads, wherein each programmable contact in said at least one localized network is connected to a conductive pad in a series connection, and wherein all programmable contacts in said at least one localized network is connected is connected to a signal port in a parallel connection.

23. The structure of claim 20, further comprising at least one localized network of programmable contacts located in said second semiconductor substrate, wherein said array of conductive pins abut said array of conductive pads, wherein at least one first programmable contact in said at least one localized network of programmable contacts is programmed, and wherein at least one second programmable contact in said at least one localized network of programmable contacts is unprogrammed.

24. The structure of claim 23, wherein each conductive pad electrically connected to said at least one first programmable contact is resistively connected to a signal port, and wherein each conductive pad electrically connected to at least one second programmable contact is electrically disconnected from said signal port.

25. The structure of claim 23, wherein each conductive pad resistively connected to said at least one first programmable contact underlies or overlies a conductive pin.

* * * * *